(12) United States Patent
Muramatsu

(10) Patent No.: US 7,025,606 B2
(45) Date of Patent: Apr. 11, 2006

(54) CONNECTING STRUCTURE FOR POWER CORD

(75) Inventor: Akira Muramatsu, Osaka (JP)

(73) Assignee: Funai Electric Co., Ltd., Osaka (JP)

( * ) Notice: Subject to any disclaimer, the term of this patent is extended or adjusted under 35 U.S.C. 154(b) by 0 days.

(21) Appl. No.: 11/159,235

(22) Filed: Jun. 23, 2005

(65) Prior Publication Data

US 2005/0287842 A1    Dec. 29, 2005

(30) Foreign Application Priority Data

Jun. 25, 2004    (JP)    ............................... 2004-188660

(51) Int. Cl.
*H01R 12/00*    (2006.01)
(52) U.S. Cl. .................................... 439/76.1
(58) Field of Classification Search ................ 439/76.1
See application file for complete search history.

(56) References Cited

FOREIGN PATENT DOCUMENTS

| JP | 3065115 U | 10/1999 |
|---|---|---|
| JP | 2001-060469 | 3/2001 |
| JP | 2003-189536 | 7/2003 |

*Primary Examiner*—Briggitte R. Hammond
(74) *Attorney, Agent, or Firm*—Morgan Lewis & Bockius LLP

(57) ABSTRACT

A small wall part is formed at a determined position of a case body to protrude upwardly therefrom. The small wall part is provided with a locking piece at an upper end, and a circuit board is provided with a cut groove at a position corresponding to the small wall part. The small wall part is fitted into the cut groove when the circuit board is arranged inside the case body. A distal end of the AC cord which has entered into the case body through a slit formed in a side wall of the case body is divided into bifurcated portions, and the bifurcated portions are arranged to stride over the small wall part. The bundles at respective distal ends of the bifurcated portions are connected to a pattern of the circuit board.

6 Claims, 3 Drawing Sheets

CONNECTING STRUCTURE FOR POWER CORD

BACKGROUND OF THE INVENTION

1. Field of the Invetion

The present invention relates to a connecting structure for a power cord having a circuit board arranged inside a case body, the power cord being adapted to be connected to this circuit board.

2. Description of the Related Art

In a conventional connecting structure for an AC cord of this type, a bundle of copper wires at a distal end of the AC cord is stripped in some areas of a soldered part between the AC cord and the circuit board, at a primary side of an electric power block of the circuit board. It has been a problem that while physical loads are applied to these stripped areas, the bundle of the copper wires starts to be broken, and the AC cord makes a short circuit between the two poles, which may be a cause for fire.

A first example of the connecting structure in the related art is shown in FIGS. 7A and 7B. In this structure, as shown in FIGS. 7A, 7B, a bushing 101 has a lower face formed of plastic to be in contact with a circuit board 102, and is provided with insertion holes 104 for inserting lead wires 103 in such a manner that the insertion holes gradually come close to a plane of the circuit board 102, in a direction from the back side of the bushing from which the lead wires 103 are drawn out toward the front side where the lead wires 103 are connected to the circuit board 102. Moreover, locking hooks 108 are projected from the lower face of the bushing 101 at opposite sides thereof, and engaging holes 109 corresponding to the locking hooks 108 are formed in the circuit board 102. The lead wire 103 whose distal end has been stripped by a determined length is inserted into an open hole 105 until it comes into contact with the circuit board 102, and then, the locking hooks 108 are inserted into the engaging holes 109 in the circuit board 102. A core wire 107 is forcibly bent so as to become parallel to a wiring pattern 110 of the circuit board 102, and a distal end of the core wire 107 is brought into tight contact with the wiring pattern 110. In this state, the core wire 107 is soldered to the wiring pattern 110 (Refer to JP-A-2003-189536, for example).

However, this structure has had a problem that the soldering work has been difficult, because the lead wire 103 was unable to be soldered until it had been inserted into the insertion hole 104.

A second example of the connecting structure in the related art is shown in FIGS. 8A and 8B. This is a holding structure for a lead wire of an electric component, in which the lead wire 204 connected to the electric component to be arranged on a chassis 201 of an electric appliance by fitting a panel 206 to the chassis 201, is held inside the electric appliance, as shown in FIGS. 8A, 8B. In this structure, rod-like holding projections 207, 207 in a bifurcated shape are projected from an inner wall face 214 of the chassis 201 up to a position close to an inner wall face 261 of the panel 206, and the lead wire 204 of the electric component is inserted between these holding projections 207, 207, whereby this lead wire 204 is held so as not to be withdrawn (Refer to Japanese Utility Model Registration No. 3065115, for example).

However, in this structure, the lead wire 204 has been simply fixed, but there has been no part to be soldered.

A third example of the connecting structure in the related art is shown in FIG. 9. In this structure, as shown in FIG. 9, core wires 315 are exposed and projected from insulating layers 314 on terminal ends of shielded wires 311 which constitute a flat cable 310. Current carrying paths 326 are formed on an FPC 320 at the same pitch as the core wires 315. The FPC 320 is provided with a positioning member 330 on the front side of an area where the current carrying paths 326 are formed. The positioning member 330 has wire fitting grooves 333 which are formed at a regular pitch in a shape of comb teeth for receiving the insulating layers 314. When the insulating layers 314 of the shielded wires 311 of the flat cable 310 have been respectively aligned with and pushed into the wire fitting grooves 333 in the positioning member 330, the core wires 315 are arranged at the determined pitch and respectively positioned just over the respective current carrying paths 326. Then, the core wires 315 are pressed against and soldered to the current carrying paths 326 (Refer to JP-A-2001-60469, for example).

However, in this structure, it has been concerned that a short circuit may occur in case where some of the core wires 315 have been broken on their way.

SUMMARY OF THE INVENTION

The present invention has been made in view of the above described problems of the related art, and an object of the invention is to provide a connecting structure for an AC cord which can completely insulate two poles of two bundles of copper wires of the AC cord from each other, and can prevent the copper wires in the bundles which have been broken from getting in contact with each other, thereby to avoid occurrence of fire due to such contact.

According to one aspect of the invention, there is provided a connecting structure for an AC cord comprising a circuit board arranged inside a case body which is formed of synthetic resin, the AC cord being adapted to be connected to the circuit board, characterized in that a small wall part is integrally formed at a determined position of the case body formed of synthetic resin so as to protrude upwardly from the case body, the small wall part having a locking piece in a substantially L-shape at an upper end thereof, and the circuit board is provided with a cut groove at a position corresponding to the small wall part, wherein the small wall part is fitted into the cut groove in the circuit board when the circuit board is arranged inside the case body, a distal end of the AC cord which has entered into the case body through a slit formed in a side wall of the case body is divided into bifurcated portions, the bifurcated portions being arranged so as to stride over the small wall part, and further, a through hole formed in the AC cord adjacent to the bifurcated portions is fitted on the locking piece in a substantially L-shape at the upper end of the small wall part to be locked thereto, whereby bundles of copper wires at respective distal ends of the bifurcated portions of the AC cord are connected to a pattern of the circuit board by soldering.

By thus configuration, the bifurcated portions of the AC cord are completely separated and insulated from each other by the small wall part which is uprightly formed integrally on the case body. Therefore, it is possible to prevent the copper wires which have been broken from getting in contact with each other, thereby to avoid occurrence of fire due to such contact. Moreover, because the through hole formed in the AC cord adjacent to the bifurcated portions is fitted on the L-shaped locking piece at the upper end of the small wall part to be locked thereto, the AC cord will not be detached nor inclined, but can be safely held. Further, the cut groove in the circuit board is engaged with the small wall part, thus enabling the circuit board to be correctly positioned with respect to the case body.

According to another aspect of the invention, there is provided a connecting structure for an AC cord comprising a circuit board arranged inside a case body which is formed of synthetic resin or metal, the AC cord being adapted to be connected to the circuit board, characterized in that a small wall part is uprightly formed at a determined position of the case body, and the circuit board is provided with a cut groove or a hole at a position corresponding to the small wall part, wherein the small wall part is fitted into the cut groove or hole in the circuit board when the circuit board is arranged inside the case body, a distal end of the AC cord which has entered into the case body through a slit formed in a side wall of the case body is divided into bifurcated portions, the bifurcated portions being arranged so as to stride over the small wall part, whereby bundles of copper wires at respective distal ends of the bifurcated portions of the AC cord are connected to a pattern of the circuit board by soldering.

By thus configuration, the bifurcated portions of the AC cord are completely separated and insulated from each other by the small wall part which is uprightly formed on the case body. Therefore, it is possible to prevent the copper wires which have been broken from getting in contact with each other, thereby to avoid occurrence of fire due to such contact. Moreover, the cut groove or hole in the circuit board is engaged with the small wall part, thus enabling the circuit board to be correctly positioned with respect to the case body.

According to another aspect of the invention, the case body is formed of synthetic resin, and the small wall part is provided at a determined position of the case body integrally and in a pointed shape directed upwardly.

Because the small wall part is integrally and uprightly provided on the case body formed of synthetic resin, the small wall part will not be fallen nor inclined, and the AC cord can be safely insulated. Moreover, because the small wall part is formed in a pointed shape, the bifurcated portions can be extended along inclination of the pointed shape of the small wall part.

According to another aspect of the invention, the case body is formed of metal, and the small wall part is provided with a pair of leg portions in a lower part thereof, the leg portions having locking hooks formed at respective lower ends thereof, while the case body is formed with locking holes into which a pair of the leg portions of the small wall part are inserted, whereby the locking hooks are locked to a lower face of the case body.

Because the locking hooks of a pair of the leg portions of the small wall part are inserted into the locking holes which are formed in the case body formed of metal, the small wall part will not be detached nor inclined, and the AC cord can be safely insulated.

According to another aspect of the invention, areas respectively surrounding the locking holes in the case body are formed in an upwardly swelled shape, so that lower ends of the leg portions of the small wall part may not protrude downwardly from the lower face of the case body, in a state where lower parts of the leg portions have been inserted into the locking holes and the locking hooks have been locked.

By thus configuration, because the areas respectively surrounding the locking holes in the case body formed of metal are formed in an upwardly swelled shape, and the lower ends of the leg portions of the small wall part which have been inserted into the locking holes will not protrude downwardly from the case body, it is possible to prevent the leg portions of the small wall part from being butted against an upper face of the apparatus body on which the case body is disposed.

According to another aspect of the invention, locking projections for fixing the bifurcated portions of the AC cord are formed on both faces of the small wall part in a vertical direction, and the locking projections are provided with locking grooves into which the bifurcated portions of the AC cord are adapted to be inserted.

By thus configuration, the bifurcated portions of the AC cord can be engaged with the locking grooves of the locking projections on both the faces of the small wall part which is uprightly provided on the case body, the bifurcated portions of the AC cord can be prevented from being separated.

DESCRIPTION OF THE PREFERRED EMBODIMENTS

Figure 1A:
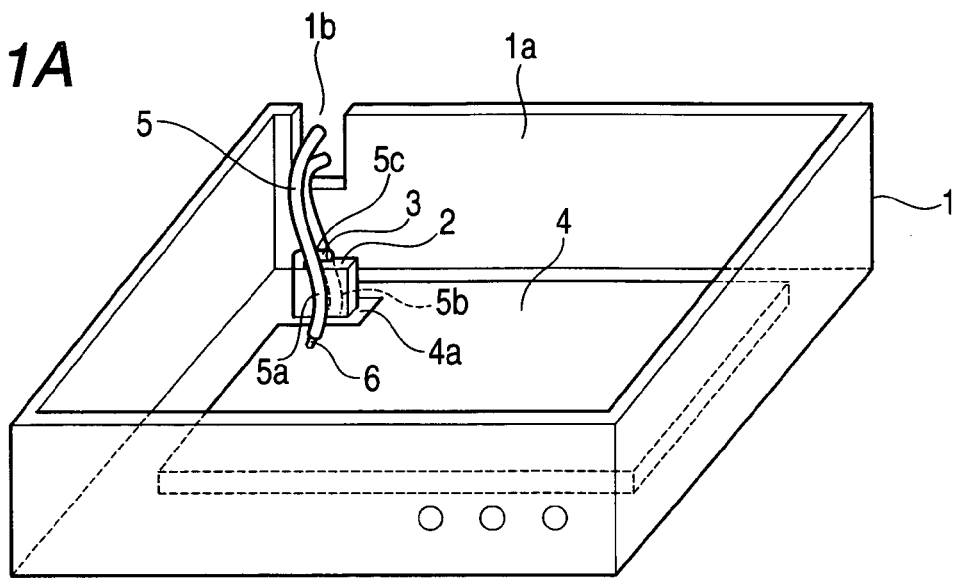
FIG. 1A is a perspective view of a general structure of a connecting structure for an AC cord in a first embodiment according to the invention.

Now, embodiments of the connecting structure for a power cord will be described referring to the drawings. In the embodiments, AC cord is used for explaining the embodiments of the invention. However, the embodiments are not limited to use the AC cord.

Figure 1B:
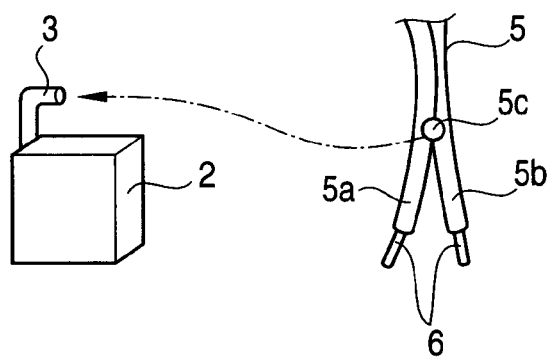
FIG. 1B is an exploded perspective view of an essential part of the connecting structure according to the first embodiment.
Figure 1C:
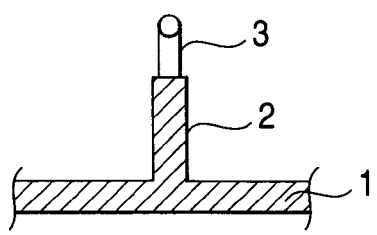
FIG. 1C is a sectional view of the essential part of the connecting structure according to the first embodiment.

FIG. 1A is a perspective view of a general structure of connecting structure for the AC cord in a first embodiment according to the invention, FIG. 1B is an exploded perspective view of an essential part thereof, and FIG. 1C is a sectional view of the essential part.

In the connecting structure for the AC cord in this first embodiment, a case body 1 formed of synthetic resin has a small wall part 2 which is integrally formed at a determined position of the case body 1 so as to protrude upwardly. The small wall part 2 is provided with a locking piece 3 in a substantially L-shape, at an upper end thereof. A circuit board 4 is formed with a cut groove 4a at a position corresponding to the small wall part 2, and the small wall part 2 is inserted into the cut groove 4 in the circuit board 4 when the circuit board 4 is arranged inside the case body 1. Moreover, an AC cord 5 which has entered into the case body 1 through a slit 1b formed in a side wall 1a of the case body 1 is bifurcated at its distal end, and bifurcated portions 5a, 5b are so arranged as to stride over the small wall part 2. Further, a through hole 5c formed in the AC cord 5 adjacent to the bifurcated portions 5a, 5b is fitted on the L-shaped locking piece 3 at the upper end of the small wall part 2 to be locked thereto. Then, a bundle of copper wires 6 in distal end parts of the bifurcated portions 5a, 5b are connected to a pattern (not shown) of the circuit board 4 by soldering.

Therefore, according to this first embodiment, the bifurcated portions 5a, 5b of the AC cord 5 are completely separated and insulated from each other by the small wall part 2 which is uprightly formed integrally on the case body 1. As the results, it is possible to prevent the copper wires which have been broken from getting in contact with each other, thereby to avoid occurrence of fire due to such contact. Moreover, because the through hole 5c formed in the AC cord 5 adjacent to the bifurcated portions 5a, 5b is fitted on the L-shaped locking piece 3 at the upper end of the small wall part 2 to be locked thereto, the AC cord 5 will not be detached nor inclined, but can be safely held. Further, the cut groove 4a in the circuit board 4 is engaged with the small wall part 2, thus enabling the circuit board 4 to be correctly positioned.

Figure 2:
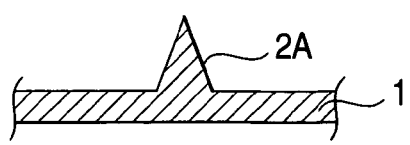
FIG. 2 is a sectional view of an essential part of the connecting structure of the AC cord in a second embodiment.

FIG. 2 is a sectional view showing an essential part of the connecting structure for the AC cord in a second embodiment.

In the connecting structure for the AC cord in the second embodiment, the case body 1 is formed of synthetic resin, and the small wall part 2A is formed at a determined position of the case body 1 integrally and in a pointed shape directed upwardly, as shown in FIG. 2.

Therefore, according to this second embodiment, because the small wall part 2A is formed in a pointed shape, the bifurcated portions 5a, 5b of the AC cord 5 can be extended along inclination of the pointed shape of the small wall part 2A.

Figure 3:
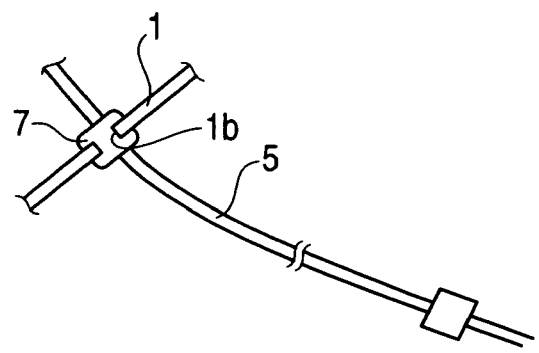
FIG. 3 is a plan view of a part showing a holding mechanism for the AC cord.

FIG. 3 is a plan view showing a part of a holding mechanism for the AC cord.

In this holding mechanism for the AC cord, a locking member 7 which is provided on a halfway of a shielded area of the AC cord 5 and has grooves on its outer periphery is inserted into the slit 1b of the case body 1, as shown in FIG. 3.

Therefore, by inserting the locking member 7 into the slit 1b, it is possible to fix the shielded area of the AC cord 5 to the case body 1.

Figure 4:
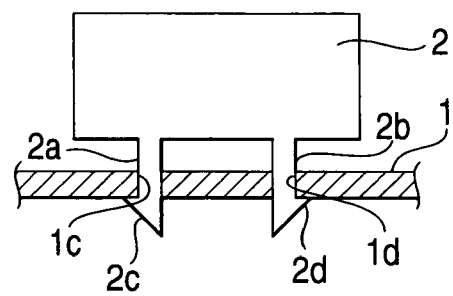
FIG. 4 is a sectional view of an essential part of the connecting structure for the AC cord in a third embodiment.

FIG. 4 is a sectional view showing an essential part of the connecting structure for the AC cord in a third embodiment.

In the connecting structure of the AC cord in the third embodiment, the case body 1 is formed of metal, and the small wall part 2 is provided with a pair of leg portions 2a, 2b, in a lower part thereof, as shown in FIG. 4. Locking hooks 2c, 2d are formed at lower ends of these leg portions 2a, 2b. The case body 1 is provided with locking holes 1c, 1d into which a pair of the leg portions 2a, 2b of the small wall part 2 are inserted, so that the locking hooks 2c, 2d can be locked to a lower face 1e of the case body 1.

Therefore, according to this third embodiment, because the locking hooks 2c, 2d of a pair of the leg portions 2a, 2b of the small wall part 2 are inserted into and locked to the locking holes 1c, 1d which are formed in the case body 1 formed of metal, the small wall part 2 will not be detached nor inclined, and the AC cord 5 can be safely insulated.

Figure 5:
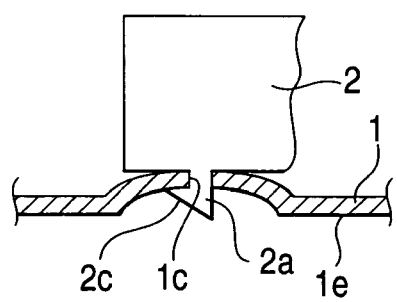
FIG. 5 is a sectional view of an essential part of the connecting structure for the AC cord in a fourth embodiment.

FIG. 5 is a sectional view showing an essential part of the connecting structure for the AC cord in a fourth embodiment.

In the connecting structure of the AC cord in the fourth embodiment, areas respectively surrounding the locking holes 1c, 1d of the case body 1 are formed in an upwardly swelled shape, as shown in FIG. 5, so that the lower ends of the leg portions 2a, 2b of the small wall part 2 may not protrude downwardly from the lower face 1e of the case body 1, in a state where the leg portions 2a, 2b have been inserted and the locking hooks 2c, 2d have been locked.

Therefore, according to this fourth embodiment, because the lower ends of the leg portions 2a, 2b of the small wall part 2 which have been inserted into the locking holes 1c, 1d will not protrude downwardly from the case body 1, it is possible to prevent the leg portions 2a, 2b of the small wall part 2 from being butted against the upper face of the apparatus body on which the case body 1 is disposed.

Figure 6:
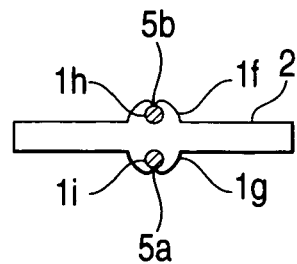
FIG. 6 is a plan view of an essential part of the connecting structure for the AC cord in a fifth embodiment.
Figure 7A:
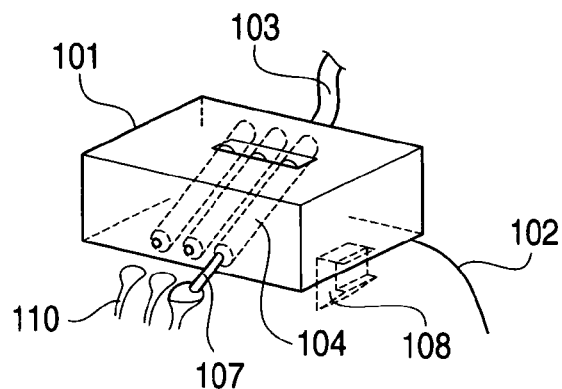
FIG. 7A is a perspective view of a bushing of an electric motor in the related art.
Figure 7B:
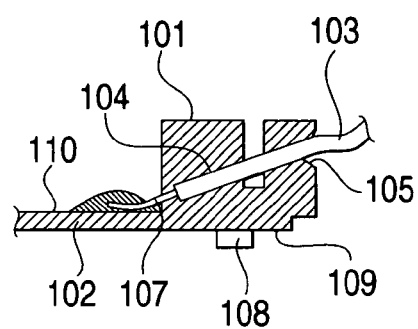
FIG. 7B is a sectional view of the bushing of the electric motor in the related art.
Figure 8A:
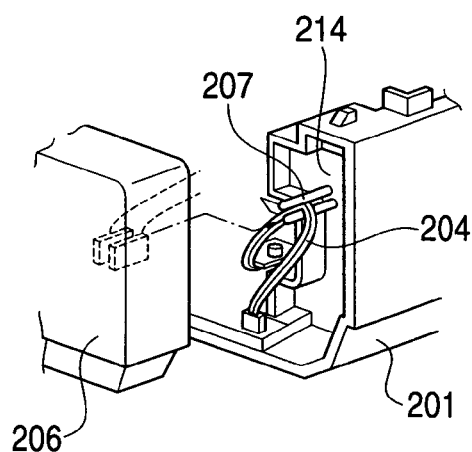
FIG. 8A is an exploded perspective view of the holding structure for a lead wire of an electrical component in the related art.
Figure 8B:
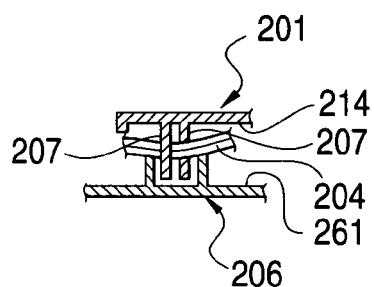
FIG. 8B is a sectional view of the holding structure for a lead wire of an electrical component in the related art.
Figure 9:
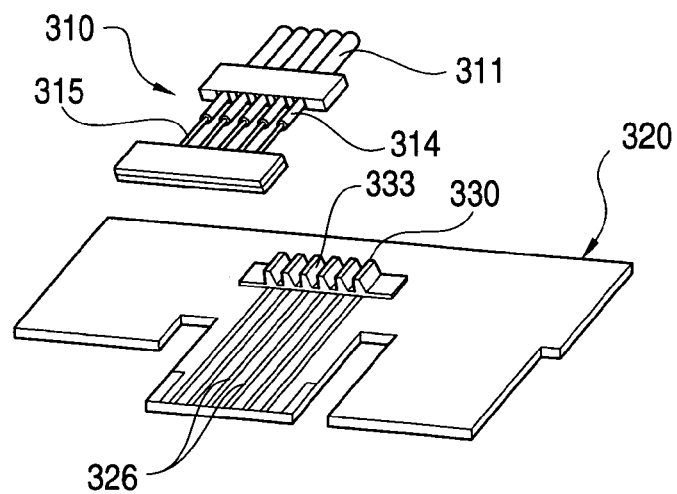
FIG. 9 is an exploded perspective view of a connecting structure for a flat cable in the related art.

FIG. 6 is a sectional view showing an essential part of the connecting structure for the AC cord in a fifth embodiment.

In the connecting structure of the AC cord in the fifth embodiment, locking projections 1f, 1g for fixing the bifurcated portions 5a, 5b of the AC cord 5 so as not to be withdrawn are formed on both faces of the small wall part 2 in a vertical direction, as shown in FIG. 6. These locking projections 1f, 1g are provided with locking grooves 1h, 1i into which the bifurcated portions 5a, 5b of the AC cord 5 are fitted.

Therefore, according to this fifth embodiment, because the bifurcated portions 5a, 5b of the AC cord 5 can be fitted into the locking grooves 1h, 1i of the locking projections 1f, 1g on both the faces of the small wall part 2 which is uprightly provided on the case body 1, the bifurcated portions 5a, 5b of the AC cord 5 can be prevented from being separated.

What is claimed is:

1. A connecting structure for a power cord, comprising:
   a case body formed of synthetic resin;
   a circuit board arranged inside the case body, the circuit board being connectable the power cord;
   wherein a small wall part is integrally formed at a determined position of the case body to protrude upwardly from the case body,
   wherein the small wall part has a locking piece in a substantially L-shape at an upper end thereof,
   wherein the circuit board is provided with a cut groove at a position corresponding to the small wall part,
   wherein the small wall part is fitted into the cut groove in the circuit board when the circuit board is arranged inside the case body,
   wherein a distal end of the power cord which has entered into the case body through a slit formed in a side wall of the case body is divided into a bifurcated portion,
   wherein the bifurcated portion is arranged to stride over the small wall part, and
   wherein a through hole formed in the power cord adjacent to the bifurcated portion is fitted on the locking piece at the upper end of the small wall part to be locked thereto, whereby bundle of copper wire at each distal end of the bifurcated portion is connected to a pattern of the circuit board by soldering.

2. A connecting structure for a power cord, comprising:
   a case body formed of at least one of synthetic resin and a metal;

a circuit board arranged inside the case body, the circuit board being connectable to the power cord, wherein a small wall part is uprightly formed at a determined position of the case body, and wherein the circuit board is provided with a cut groove or a hole at a position corresponding to the small wall part, wherein the small wall part is fitted into the cut groove or hole in the circuit board when the circuit board is arranged inside the case body, wherein a distal end of the power cord which has entered into the case body through a slit formed in a side wall of the case body is divided into bifurcated portion, and wherein the bifurcated portion is arranged to stride over the small wall part, whereby bundle of copper wire at each distal end of the bifurcated portion is connected to a pattern of the circuit board by soldering.

3. A connecting structure for a Power cord according to claim 2, wherein the case body is formed of synthetic resin, and wherein the small wall part is provided at a determined position of the case body integrally and in a pointed shape directed upwardly.

4. A connecting structure for a power cord as according to claim 2, wherein locking projections for fixing the bifurcated portions of the power cord are formed on both faces of the small wall part in a vertical direction, and wherein the locking projections are provided with locking grooves into which the bifurcated portions of the Power cord are adapted to be inserted.

5. A connecting structure for a power cord according to claim 2, wherein the case body is formed of metal, and wherein the small wall part is provided with a pair of leg portions in a lower part thereof, wherein the leg portions have locking hooks formed at respective lower ends thereof, while the case body is formed with locking holes into which a pair of the leg portions of the small wall part are inserted, whereby the locking hooks are locked to a lower face of the case body.

6. A connecting structure for a power cord according to claim 5, wherein areas respectively surrounding the locking holes in the case body are formed in an upwardly swelled shape, so that lower ends of the leg portions of the small wall part may not protrude downwardly from the lower face of the case body, in a state where lower parts of the leg portions have been respectively inserted into the locking holes and the locking hooks have been locked.

* * * * *